United States Patent [19]

Nossen

[11] 4,291,269

[45] Sep. 22, 1981

[54] SYSTEM AND METHOD FOR FREQUENCY DISCRIMINATION

[75] Inventor: Edward J. Nossen, Camden, N.J.

[73] Assignee: RCA Corporation, New York, N.Y.

[21] Appl. No.: 52,733

[22] Filed: Jun. 28, 1979

[51] Int. Cl.³ .......................................... G01R 23/14
[52] U.S. Cl. ............................... 324/79 D; 324/77 G
[58] Field of Search .................. 324/77 B, 77 G, 77 R, 324/78 D, 79 D

[56] References Cited

U.S. PATENT DOCUMENTS

4,037,151  7/1977  Takeuchi ......................... 324/77 G

*Primary Examiner*—Michael J. Tokar
*Attorney, Agent, or Firm*—Samuel Cohen; Robert L. Troike; Donald W. Phillion

[57] ABSTRACT

A means and method for fast determination of the frequency of an input signal comprising mean for digitizing and storing the digitized bits of the input signal in an input register of N bits at a bite rate $f_c$. Other means generate a series of digitized reference signals whose frequencies are represented by patterns of binary 1's and 0's and spaced apart by predetermined frequency intervals. At least one digitized reference signal is clocked into a reference signal register during each time period $1/f_c$. The digitized reference signals are successively compared to the digitized input signals to produce output signals whose magnitudes are proportional to the degree of correlation therebetween. Further, means are provided to determine the largest output signal and the frequency of the reference signal which produced said largest output signal.

15 Claims, 4 Drawing Figures

SYSTEM AND METHOD FOR FREQUENCY DISCRIMINATION

This invention relates generally to systems and methods for determining the frequency of a signal and more particularly, by comparing, in a very short period of time the received signal with a large number of reference signals (frequency cells) having different frequencies.

There are many schemes in the present art to detect the frequency of an incoming signal. Some of such systems involve phase locked loops which, in a sensitive coherent receiver, may have an acquisition range of about 100 Hz. In order to search a 30 KHz uncertainty range, 300 or more separate tests may have to be made. If 100 ms are alloted for each attempted phase lock, the frequency search can take as long as thirty seconds. Other forms of frequency determination include spectrum analysis where a parallel search of a number of frequency cells can be implemented with a bank of filters, which may be real or synthesized by means of the fast Fourier transform (FFT) algorithm. A large number of filters is expensive while the FFT requires a considerable amount of hardware or software and the execution time can be appreciable if a large number of multiplications are required. All of the foregoing well-known systems are either quite complex and expensive or require relatively long execution times or have both characteristics.

In accordance with a preferred form of the invention, there is provided means for testing the frequency of each of many reference signals with the frequency of an input signal in faster than the real time by means of a time sequential correlation process. A first means is provided for digitizing and storing the digitized bits of an input signal at a bit rate $f_c$. Other means are provided for generating a successive series of digitized reference signals whose frequencies are represented by binary 1's and 0's and spaced apart by predetermined frequency intervals. A clocking means clocks at least one reference signal into a reference register means during a time period $1/f_c$. Comparing means then compare the digitized input signal with successive reference signals to produce output signals whose magnitudes are proportional to the degree of correlation therebetween. Finally, there is provided means for determining the largest output signal and the frequency of the reference signal which produced said largest output signal.

In one form of communication, a plurality of tones are modulated onto a carrier in a particular sequence with each tone representing a number of bits. For example, with a group of sixty-four tones, six bits can be encoded on each tone with each of the six bits representing one channel of information and being either a binary 0 or a binary 1. The tones are transmitted in time synchronous segments with each segment being known as a "symbol," that is, a single tone existing for a given interval of time and representing the bits in six channels of information.

One arrangement employs sixty-four tones extending from 300 Hz to 2,700 Hz and spaced apart 37½ Hz, with the sixty-four tones being modulated upon a carrier of 30 MHz.

In the reception and decoding of such a signal, several problems must be solved, many of which involve the determination of the frequencies of the tones (symbols).

The incoming signal frequency has a Doppler shift which, at a relative velocity of mach 1 between the transmitter and the receiver, can be about ±30 Hz. Such Doppler effect also exists in the sixty-four tones modulated upon the carrier signal. Accordingly, it is first necessary to determine the Doppler Shift of the RF carrier signal which is accomplished generally by setting the frequency of the local oscillator at the receiver to the frequency of the expected carrier signal (after being heterodyned down to an intermediate frequency) and then determining the Doppler shift of a selected tone, such as a 1,200 Hz tone, which is modulated upon a preamble portion of the received signal. At mach 1 velocity between transmitter and receiver, the Doppler shift of the expected 1,200 Hz tone lies within ±30 Hz. During this phase of the reception, known as the acquisition phase, the system will generate a series of reference signals in digitized form covering the range of the expected Doppler shifts in 5 Hz steps and which extends from approximately 30 Hz below the expected tone frequency of 1,200 Hz to 30 Hz above 1,200 Hz.

When correlation between the frequency of the input signal and a reference signal of known frequency is obtained, the Doppler shift is known and the frequency of a local oscillator is shifted to offset the Doppler effect. Thereafter, the expected 1,200 Hz tone will be extracted from the received signal as a 1,200 Hz tone in fact.

The next function of the system is to obtain synchronism with the received symbols and to identify the frequency of each received symbol, which will be one of sixty-four frequencies. The identification of the tone frequency is also accomplished by the present invention as well as the synchronizing signals identifying the beginning of each received symbol.

The particular system described herein is employed primarily as a vehicle to describe the invention, and has been selected largely because it illustrates the ability of the invention to identify a continuous signal of constant frequency and also to identify the frequencies of what has been defined above as symbols and which are received as a series of time synchronous tones of different frequencies.

Figure 1:
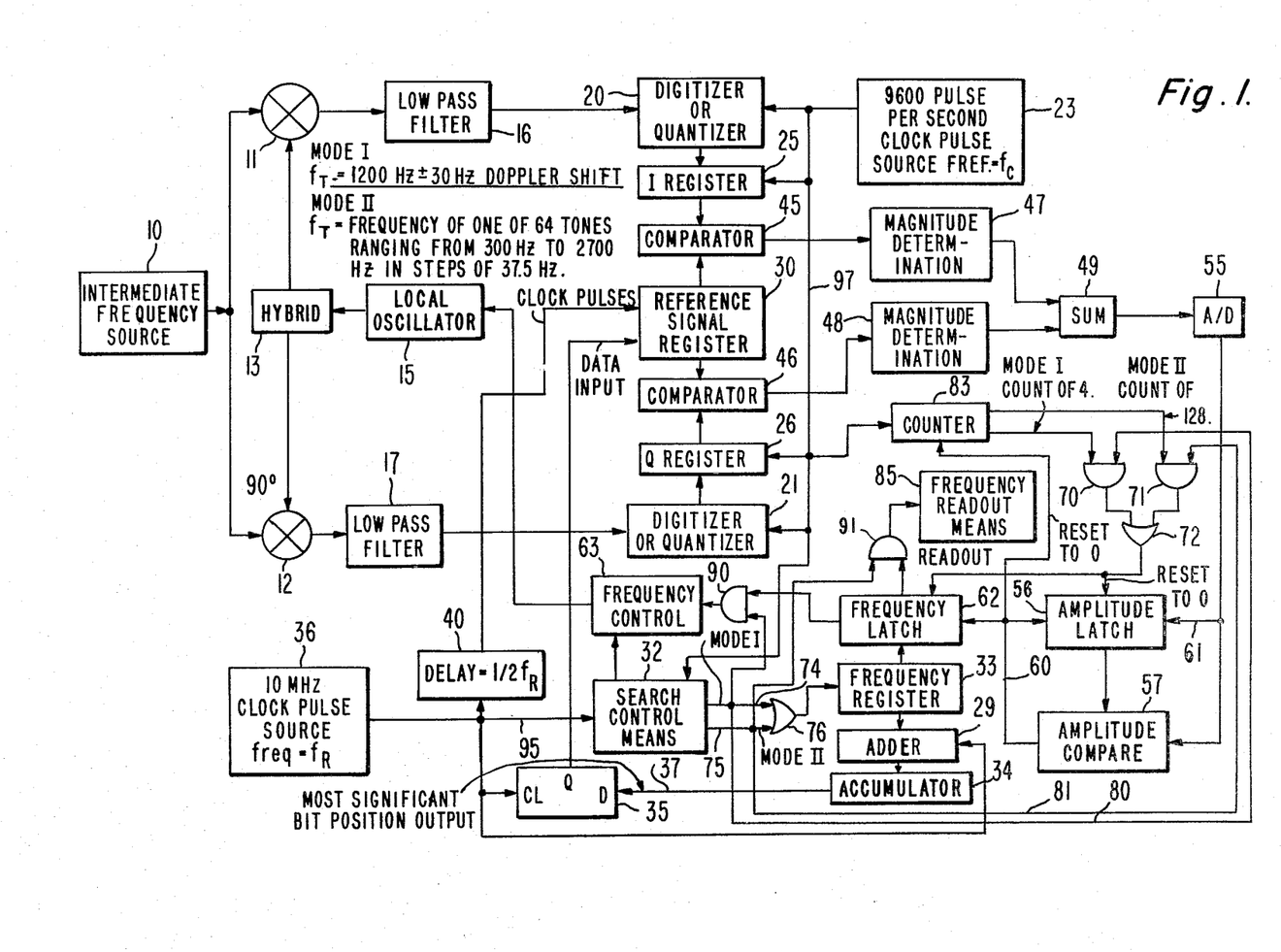
FIG. 1 is a block diagram of a system embodying the invention.

Referring now to FIG. 1, a signal at intermediate frequency is supplied from intermediate frequency source 10 to the two mixers 11 and 12 in parallel. Also supplied to mixers 11 and 12 are the outputs of hybrid 13 which generates quadrature signals from the output of local oscillator 15, thereby producing quadrature signals at the output of mixers 11 and 12 which are respectively supplied to low pass filters 16 and 17. The low pass filters 16 and 17 remove an unwanted double frequency component and pass the quadrature base band signals to digitizers (or quantizers) 20 and 21, respectively. The signals supplied to digitizers 20 and 21 are analog in nature and are digitized by means of digitizer 20 at a 9,600K bit per second rate from the output of clock pulse source 23, to produce a series of binary 0's and 1's which represent the frequency of the signal. These binary 1's and 0's are entered serially into I shift register 25 and Q shift register 26, respectively, from the digitizers 20 and 21 at the 9,600 Hz rate. In the particular system shown in FIG. 1, and I and Q registers 25 and 26 each have 256 bit positions therein which, when filled with binary 1's and 0's at the 9,600K bit per second clock pulse source 23, represent the length of a symbol, which is 26.67 milliseconds.

The 9,600K bit per second clock pulse rate is selected to satisfy the Nyquist theory of sampling which requires a sampling rate equal to twice the highest frequency to be analyzed. In the particular system being discussed, the frequency of the highest tone is 2,700 Hz. Therefore, a 9,600K bit per second sampling rate is sufficient to meet the requirements of the Nyquist theory. The 256 bits of the I and Q registers 25 and 26 are sufficient to retain, for example, 8 cycles of a 300 Hz tone and sixty-four cycles of a 2,400 Hz tone.

The search control means 32, the frequency register 33, the adder 29 and the accumulator 34 together constitute an arithmetic frequency synthesizer (AS) for generating a series of digitized reference signals of different frequencies. As discussed above, such frequencies cover a range of from 300 Hz to 2,700 Hz, spaced apart 37.5 Hz, beginning at the lower end of the range and progressively increasing to the upper end of the range, and including the frequencies of the expected signals.

The operation of an arithmetic frequency synthesizer will be described in more detail later herein. At this point it is sufficient to state that the output frequency is supplied by accumulator 34 and appears on lead 37 which is the most significant bit position of the accumulator 34. Basically, accumulator 34 is a register which accumulates binary increments contained in a frequency register 33 and which are supplied through adder 29 to accumulator 34 at a given clock rate so that the accumulator 34 overflows periodically. Each time it overflows, it produces an output signal on output lead 37 with each overflow constituting a cycle of operation of the arithmetic synthesizer. During each cycle of the operation, the signal on output lead 37 will be a binary 0 for one half of the cycle and a binary 1 for the other half of the cycle.

By means also to be described above, the output of the accumulator 34 in cooperation with the conventional D-type flip-flop 35, functions to gate the output of 10 MHz clock pulse source 36 into the reference register 30 in patterns of binary 1's and 0's which represent the various reference signal frequencies. The aforementioned patterns of binary 1's and 0's are determined by the cycling rate of accumulator 34 which can be changed by changing the binary increments added thereto.

Before describing in detail the generation of the reference signals supplied to reference register 30, it should be noted that the system of FIG. 1 has two modes of operation, mode I and mode II. Mode I is employed in the acquisition phase of the operation wherein the RF carrier signal is received with one tone, for example a 1,200 Hz tone, modulated thereon. The received signal is first heterodyned down to an intermediate frequency and then to the expected 1,200 Hz tone by means of local oscillator 15 and mixers 11 and 12. Next, by means of the invention, the amount of Doppler shift is determined and the frequency of the local oscillator is corrected the offset the Doppler shift. The system is then ready to receive data which constitutes the mode II portion of the operation. During mode II the sixty-four different tones are receivable, one at a time, in a coded order with each tone representing binary 1's and 0's of six channels of information. As discussed above, the frequencies of these tones, and thereby the binary 1's and 0's of each channel, are determined by the present invention.

Consider now the reference signals, which are generated in the following manner. As mentioned above, the contents of the most significant bit position of accumulator 34 are supplied to data input D of conventional D-type flip-flop 35 and will be a binary 1 during half of the total count capacity of accumulator 34 and a binary 0 during the other half of the total count capacity of accumulator 34. The Q output of flip-flop 35 will follow the signal supplied to data input D upon the occurrence of the first clock pulse supplied to the clock input (CL) of flip-flop 35. Thus, upon the occurrence of such first clock pulse after the most significant bit position of accumulator 34 becomes a binary 1, the Q output of flip-flop 35 will rise to its high level. The clock pulses from the 10 MHz clock pulse source 36 will then pass through delay means 40 and clock binary 1's into the reference signal register at a 10 MHz rate until the significant bit position of the accumulator 34 changes to a binary 0. The function of delay means 40 is to prevent a race condition between the particular 10 MHz clock pulse which changes the level of the Q output of flip-flop 35 and that same clock pulse acting as a clock pulse for the reference signal register 30. In other words, delay means 40 assures that the Q output will change levels before the first clock pulse is supplied to the reference signal register 30.

When the contents of the most significant bit position of accumulator 34 is a binary 0, the clock pulses from source 36 will enter binary 0's into the reference signal register at a 10 MHz rate.

To understand how correlations between several digitized reference signals of different frequencies entered into reference register 30 are made with the input signal contained in input registers 25 and 26, during the period of each 9,600K bit per second clock pulse, an examination of the relative timing of the 9,600K bit per second clock pulse and the 10 MHz clock pulse source 36, the 256 bit position length of registers 25 and 26 and the 256 bit position reference register 30 must be made. This can best be done by a specific example.

Figure 2:
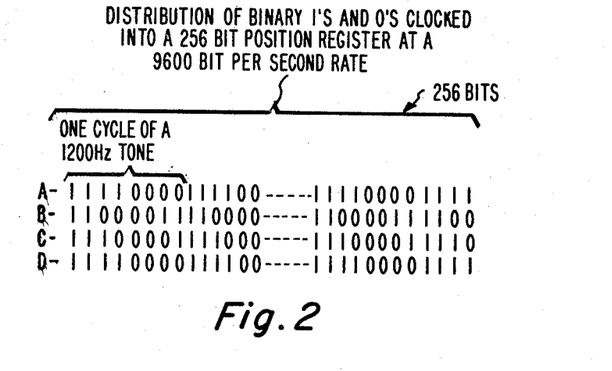
FIG. 2 shows a series of binary patterns of 1's and 0's representing frequencies and how they correlate with each other.

Assume that a 1,200 Hz signal is being clocked into the I and Q registers 25 and 26 at a 9,600K bit per second rate ($f_c$). Since the I and Q registers each have a length of 256 bit positions it follows that the length of time required to fill the I and Q registers is $256 \div 9,600 = 26.67$ milliseconds, during which time period 32 cycles of the 1,200 Hz tone can be stored in registers 25 and 26. Each cycle occupies $256 \div 32$ cycles or eight bit positions, four of which are binary 1's and four of which are binary 0's. FIG. 2 illustrates this distribution of binary 1's and 0's clocked into the 256 bit position I and Q shift registers 25 and 26 at a 9,600 bit per second rate ($f_c$). The 256 bits of 1,200 Hz input signal (32 cycles) will thus be staticized in the I and Q register 25 and 26 for one 9,600 bit per second clock period, $1/f_c$, which is 1/9,600 of a second or slightly greater than 104 μs. By clocking bits into the reference register 30 at a high enough clock rate, it is possible to fill up the 256 bit position reference register 30 several times during the single 9,600 bit per second clock period.

As an example, to fill the 256 bit positions of the reference register 30 with four different sets of 256 bits would require the gating of 4×256 or 1,024 bits into the reference register 30 during the single 9,600 bit per second clock period of slightly more than 104 μs. Multiplying 1,024 by 9,600 (1024 divided by $1/f_c$) results in a clocking rate of 9.83 MHz for reference signal registor 30. In fact, the clocking source 36 is a 10 MHz clock pulse source which is more than sufficient to successively clock four different reference signals, each of 256 bits in length, into the reference register 30 where they will be compared with the contents of the I and Q registors 25 and 26 in comparator means 45 and 46, respectively. During sixteen periods of the 9,600 bit per second clock pulses, a total of sixty-four different reference signals can be clocked into the reference signal register 30. The fact that the last four tones of the sixty-four tones will be clocked through when the bits of the input signal in the I and Q registers 25 and 26 have shifted sixteen bits does not represent a sufficient degradation of correlation to affect the satisfactory operation of the system.

During mode I, which is the acquisition period, with the incoming signal being nominally a 1,200 Hz tone modulated upon a 30 MHz carrier, reference signals generated by the system can range from 1170 Hz to 1230 Hz which should cover the range of any expected Doppler frequency shift caused by a relative velocity between the transmitter and the receiver of ±mach 1.

It is only because the frequency of the reference signals are represented as binary 1's or 0's that they can be shifted into the reference shift register 30 at such a high rate of speed and compared to the relatively staticized input signal in the I register 25 and 26. An understanding of how a reference signal is generated and shifted through the reference registor 30 where it is compared with the signals in the I and Q registers 25 and 26 can be best gained by another specific example. Assume that the reference signal to be generated is to have a frequency of 1,200 Hz. This requires that the pattern of four binary 1's alternating with four binary 0's be supplied to the 256 bit positions of reference signal register 30 by 10 MHz clocking means 10.

As discussed above, the generation of a binary 1 or a 0 is determined by the output of the accumulator 34 which is supplied to the D input of flip-flop 35 via lead 37. It is apparent that the output of the most significant bit position of accumulator 34 must be a binary 1 during four clock pulses of the 10 MHz clock pulse source 36 and must be a binary 0 during the next four output pulses from clock pulse source 36. Therefore, the fill-up frequency of the accumulator 34 must be ⅛ the frequency of the 10 MHz clock pulse source 36 so that the Q output of flip-flop 35 is alternately high and low for four output pulses of the clock pulse source 36 to form the pattern of binary 1's and 0's shown in FIG. 2A.

The frequency of the output of accumulator 34 to generate a given reference tone $f_R$ is determined in the following manner. First the number of cycles $N_c$, of the tone which can be stored in the 256 bit I and Q registers 25 and 26 at a clocking rate of 9,600 clock pulses per second, and which must be reproduced in the 256 bit position reference signal register 30, is given by the following expression:

$$N_c = f_T \times 256/9600 \tag{a}$$

where $f_T$ = Tone Frequency

The number of bits per cycle $N_B$ in the 256 bit position registers 25, 26 and 30 for a given tone is then determined by the following expression:

$$N_B = 256 \div N_c \tag{b}$$

The frequency $f_A$ of the output of the accumulator 34 is then determined as follows:

$$f_A = f_R \div N_B \tag{c}$$

where $f_R$ is the clocking rate of the bits into the reference signal register

Combining expressions (a), (b), and (c) gives an expanded expression for determining the accumulator frequency $f_A$:

$$f_A = f_R \times N_c/256 = f_R \times f_T \times 256 \div 256 \times f_c \tag{d}$$

If $f_T$ is a 1,200 Hz tone, then $f_A$ is equal to 1.25 MHz. As another example, if $f_T$ is a 2,700 Hz tone, then $f_A$ is equal to 2.8125 MHz.

In mode I bit patterns representing frequencies ranging from 1.170 Hz to 1,230 Hz in 5 Hz steps are successively clocked into reference signal register 30 and compared with the contents of the I and O registers 25 and 26 by comparators 45 and 46. The comparators 45 and 46 will produce outputs of plus or minus polarity and of a magnitude in proportion to the degree of correlation of the signal in reference register 30 and the quadrature signals in registers 25 and 26. The absolute magnitudes of the outputs of comparators 45 and 46 are determined by magnitude determining means 47 and 48, the outputs of which are summed together in summing means 49. The output of summing means 49 is supplied to the analog-to-digital (A/D) converter 55 whose output is supplied to, and stored in, amplitude latch 56 via lead 61 and is also supplied to amplitude comparing means 57.

Each time the A/D converter 55 produces an output representing an amplitude greater than the one stored in amplitude latch 56, such new amplitude replaces the previous largest amplitude stored in latch 56. The aforementioned function is effected by amplitude comparing means 57 which constantly compares the output of A/D converter 55 with the value stored in amplitude latch 56. Any time the output of A/D converter 55 is greater than the amplitude stored in latch 56, the stored value is replaced by the new greater amplitude by means of control lead 60 which permits the new digitized amplitude to be entered into latch 56 via lead 61.

At the same time the frequency which generated the latest and largest output from A/D converter 55 is stored in frequency latch 62 via control lead 60 which causes the transfer of the contents of frequency register 33 into the frequency latch 62. Thus, at the end of the acquisition portion of the signal (mode I) the frequency latch 62 will contain the frequency which generated the largest output from A/D converter 55 and which is the frequency having the greatest correlation with the contents of the I and Q registers 25 and 26.

Assume such frequency is 1,225 Hz which means that the Doppler shift is 25 Hz. The frequency control means 63 responds to the search control means 32 at the end of the acquisition mode I and to the contents of the frequency latch 62 to change the frequency of the local oscillator 15 by 25 Hz to compensate for the Doppler shift and to cause a 1,200 Hz tone to be supplied from mixers 11 and 12 to low pass filters 16 and 17 and then into the correlator portion of the system.

During mode I the output of search control means 32 is supplied to the frequency register 33 through lead 74 and OR gate 76 and is also supplied to one input of AND gate 70 via lead 80 and also to one input of AND gate 90 to prime both AND gates 70 and 90. At the count of four, the counter 83, in response to four clock pulses from 9,600 Hz clock pulse source 23, supplies an output signal through primed AND gate 70 and OR gate 72 to reset amplitude latch 56 to zero and also to cause readout of frequency latch 62 into frequency control means 63 which, as mentioned above, adjusts the frequency of the local oscillator to compensate for Doppler shift. The resetting of amplitude latch 56 to zero is required to prepare the system for the mode II or data receiving phase.

Before discussing mode II, the quadrature demodulation employed in FIG. 1 will be discussed. Because the initially received RF carrier signal, which can be of the order of 30 MHz, is heterodyned down to an intermediate frequency, by means not shown, it is necessary to employ quadrature demodulation mixers 11 and 12 and hybrid 13 which divides the output of local oscillator 15 into two signals phased 90° apart. Thus, the outputs of mixers 11 and 12 are also phased 90° apart and are supplied in quadrature, and in digitized form to the I register 25 and the Q register 26 through digitizers (or quantizers) 20 and 21, respectively. The use of quadrature demodulation is necessary since the phase of the intermediate frequency signal is not known and could be in the phase with the output of local oscillator 15, 90° out of phase with the output of local oscillator 15 or anywhere in between. The use of quadrature demodulation insures that all components of the received signal are considered in the correlation process.

More specifically, assume that the digitized 1,200 MHz tone signal represented by the pattern of bits in FIG. 2A is stored in the I register 25. The same 1,200 Hz tone signal is also stored in the Q register 26, but 90° phased removed therefrom and is represented by the pattern of bits shown in FIG. 2B. It can be seen that the pattern of bits of FIG. 2B is displaced by two bits from the pattern of bits of FIG. 2A, which represents a 90° phase shift.

Assume, as a first condition, that the phase of the intermediate frequency signal from source 10 is 45° out of phase with the output of local oscillator 15 so that the outputs of the two low pass filters 16 and 17 are substantially equal and that a digitized representation of the input signal is entered into both the I register 25 and the Q register 26 and is represented by the pattern of bits of FIGS. 2A and 2B, respectively. Maximum correlation between the digitized 1,200 Hz tone signal passing through the reference signal register 30 will occur when the bits of pattern of such reference signal bears a relationship with the bit patterns of FIGS. 2A and 2B as shown in FIG. 2C.

It can be seen that the bit pattern of FIG. 2C is displaced one bit position from the bit patterns of both FIGS. 2A and 2B but in different directions so that the net correlation of the bit pattern of FIG. 2C with each of the bit patterns of FIGS. 2A and 2B is 50%. For example, consider the bit patterns of FIG. 2B and 2C wherein three binary 0's and three binary 1's of each cycle of eight bits correspond in time, and in two bit positions a 0 is compared with a 1 so that resultant number of correlating bit positions is four, which represents 50% correlation. Since such 50% correlation occurs in the comparisons of the reference signal with contents of both the I register and the Q register, the total correlation is 100%.

Consider now the case where the phase of the intermediate frequency signal is the same as the output of local oscillator 15. In such a case there will be an output from mixer 11 but no output from mixer 12. Therefore, the entire intelligence signal will pass through low pass filter 16 and then through digitizer 20 and into I register 25. The Q register 26 will contain a random pattern of bits bearing no relation to the received signal so that the output of the comparator 46 will be the product of such random pattern of bits and will be near zero.

However, the output of comparator 45 will become maximized when the digitized 1,200 Hz reference signal is entered into reference signal register 30 and is fully in phase with the contents of the I register 25, which is also a 1,200 Hz signal represented by the bit pattern of FIG. 2A. The bit pattern of the signal in reference register 30, at maximum correlation, is shown in FIG. 2D.

At the end of acquisition mode I, the search control means 32 switches to the mode II portion of the reception of the signal. In mode II, as stated above, the received signal consists of a group of sixty-four tones ranging from 300 Hz to 2,700 Hz, spaced 37.5 Hz apart, and received in a time synchronous manner.

In mode II the search control means 32 supplies frequency determining data, i.e. digital increments, to frequency register 33 which, in turn, supplies such increments through adder 29 to accumulator 34 at a clock rate $f_R$. Such increments cause the accumulator 34 to generate the necessary gating frequencies for properly gating the output of 10 MHz clock pulse source 36 to successively produce the patterns of binary 1's and 0's representing the sixty-four tones. Further, in mode II, search control means 32 primes AND gate 71 through lead 81 (and also primes AND gate 91) so that at the count of 128 of counter 83 a pulse will be supplied through AND gate 71 and OR gate 72 to reset the amplitude latch 56 to zero and also to cause a readout of the contents of the frequency latch into the frequency readout means 85, for decoding into channel data and determining symbol synchronization.

The time length of a symbol is 26.67 ms and will just exactly fill the 256 bit positions of the I and Q registers 25 and 26 when clocked therein in digitized form at a clock rate of 9.6 kHz. As discussed above, the period of each pulse of the 9,600 pulse per second clock rate is slightly more than 104 $\mu$s and will enable the passage of four complete reference signals to be shifted through reference signal register 30. Thus, sixteen periods of the 9,600 pulse per second clock rate provides sufficient time for the generation of all sixty-four tones and the supplying of such tones into reference signal register 30.

The generation of each group of four reference signals is triggered by a clock pulse from 9,600 pulse source 23 through lead 97 which is connected to search control means 32. At the end of the generation of four reference signals, which will occur slightly before the expiration of a period $1/f_c$ of one of the clock pulses of source 23, the search control means 32 will wait a few $\mu$ seconds until the occurrence of the next clock pulse from source 23 to generate the next four tone frequencies.

Since the symbols are received consecutively, portions of two symbols can occupy the I and Q registers simultaneously. For purposes of simplicity and clarity, the following discussion will relate only to the operation of the I register with respect to the correlation process and it will be understood that the Q register is also involved in a manner discussed above.

Figure 3:
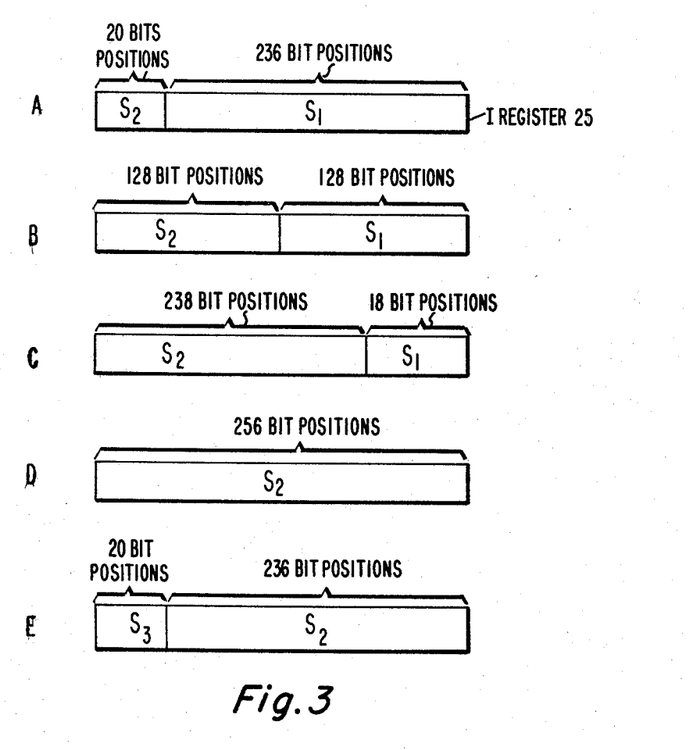
FIG. 3 shows by stages, the entry of successive input signals into an input register.

Assume, for example, that at some point in the operation of mode II of the system, the I register contains 236 bit positions of signal $S_1$ and 20 bit positions of $S_2$, as shown in FIG. 3A. Since $S_2$ occupies 20 bit positions of the I register, maximum correlation will have already occurred between $S_1$ and the corresponding digitized reference tone supplied to reference register 30. Assume that the maximum correlation occurred with symbol $S_1$ when symbol $S_2$ occupied only 9 bit positions of the I register. When $S_2$ occupies an additional 16 bit positions, or 25 bit positions, a second correlation with $S_1$ will occur, although of a lesser magnitude since $S_1$ would then occupy only 231 bit positions of the register.

FIG. 3B represents the I register 108 clock periods later when $S_1$ and $S_2$ each occupy 128 bit positions. Under the conditions of FIG. 3B the symbols $S_1$ and $S_2$ will produce equal outputs as a result of correlation with a corresponding reference signal passing through the reference register 30.

As shown in FIG. 3B the symbol $S_1$ has passed by its maximum correlation by well over one hundred $1/f_c$ clock periods and the amplitude latch 56 of FIG. 1 has retained the amplitude resulting from the maximum correlation of symbol $S_1$ with its correlating reference signal since no greater amplitude reading could have occurred under normal operation of the system. Accordingly, to provide for the recognition of the symbol $S_2$, the amplitude latch 56 is reset to zero at the count of 128 of counter 83 thereby providing for a recognition of correlation of the symbol $S_2$ as it occupies an increasing number of the bit positions of the I register 25.

It is to be noted that counter 83 is reset to zero each time a new amplitude high is outputted from the A/D converter 55. However, when $S_1$ reached its maximum correlation there was no higher output from A/D converter 55 and counter 83 continued to count to 128, at which count the amplitude latch 56 was reset to zero thereby providing for a new amplitude high to be stored therein.

Furthermore, at the count of 128 of counter 83, the contents of frequency latch 62 are read out through AND gate 91, which is primed during mode II, and into frequency readout means 85 which can decode the tone into the appropriate binary 1's and 0's of the six channels of information being received.

FIG. 3C shows the condition of the I register 110 clock periods later when symbol $S_1$ occupies 18 bit positions and symbol $S_2$ occupies 238 bit positions. At this time, correlation with symbol $S_2$ is occurring each time the corresponding reference signal is passed through the reference register 30. Each subsequent correlation of symbol $S_2$ with the corresponding reference signal produces a larger output from the A-to-D converter 55 which is recorded in amplitude latch 56 after being compared with the previous recorded amplitude by amplitude compare means 57. Also with each recording of a new high amplitude, the counter 83 is reset to zero and the frequency latch 62 records the frequency contained in the frequency register 33.

After another 18 clock pulses have occurred, the symbol $S_2$ occupies all the 256 bit positions of the I register as indicated in FIG. 3D and maximum correlation either has occurred in the prior 8 bit positions or will occur in the next following eight pulses of $f_c$. As in the case of maximum correlation for symbol $S_1$, a maximum correlation of symbol $S_2$ will result in the counter 83 beginning its count to a total of 128 at which time the amplitude latch 56 will be reset to zero and the frequency recorded in the latch 62 will be supplied through primed AND gate 91 to frequency readout means 85. However, before the count of 128 is reached, the next occurring symbol $S_3$ begins to enter into the register as indicated in FIG. 3E and the entire cycle begins anew.

The arithmetic synthesizer comprised of frequency register 33, adder 29 and accumulator 34 function generally in the following manner. The accumulator 34 is a register which accumulates a digital value supplied thereto from frequency register 33 through adder 29 at the occurrence of each clock pulse from the 10 MHz clock pulse source 36. The accumulator has a selected number of binary bit positions which eventually become filled with the total capacity determined by the number of bit positions. For example, an accumulator with 8 bit positions has a total capacity of 256 so that when the increments added thereto from frequency register 33 through adder 29 exceed 255, the accumulator 34 will overflow and output a signal from its most significant bit position onto lead 37. The increment supplied to accumulator 34 from frequency register 33 and the clock pulse rate determine the rate of fill-up time or overflow of accumulator 34. For example, if frequency register 33 supplies an increment of binary 10, which is a decimal 2, to an 8 bit position accumulator at a clock rate of 10 MHz, the accumulator will overflow every 128 clock pulses so that the output frequency or fill-up frequency of the accumulator is equal to $10^7$ MHz divided by 128. As will be discussed later, the increment supplied to the accumulator from frequency register 33 is determined by the search control means 32.

In the particular system being described assume the accumulator to be a 24-bit position accumulator and therefore has a capacity of 16,777,216. In prior discussion it has already been established that the accumulator must have an overflow frequency of 1.25 MHz in order to gate a pattern of clock pulses from the 10 MHz source 36 to reference register 30 representative of a reference tone of 1,200 Hz. Such a pattern of gating pulses, as discussed above, consists of alternate groups of four binary 1's and four binary 0's which form one cycle of the 1,200 Hz tone.

It is now necessary to determine what increment I must be added to the 24-bit position accumulator clocked at a 10 MHz rate in order to produce an overflow frequency of 1.25 MHz. Such a relationship is given by the following expression:

$$I = f_A \times 2^n \div f_R \qquad (e)$$

where $f_A$ is the desired accumulator frequency, n is the number of bit positions of the accumulator, and $f_R$ is the clocking rate.

In the particular instance at hand, it is desired that $f_A$ be 1.25 MHz, $n=24$, and $f_R=10^7$. Inserting these values in the above expression (e) gives a value of 2,097,152 for I. Thus, I must be incremented by the binary equivalent of 2,097,152 from frequency register 33 in order to overflow at a frequency of 1.25 MHz. Obviously, the required increments for other tones can easily be calculated from expression (e) above.

Reference is made to copending application Ser. No. 937,834, filed Aug. 29, 1978, by Edward J. Nossen, (the present inventor) entitled Frequency Synthesizer for a further and more detailed discussion of an arithmetic synthesizer. The aforementioned application is incorporated herein by reference.

Figure 4:
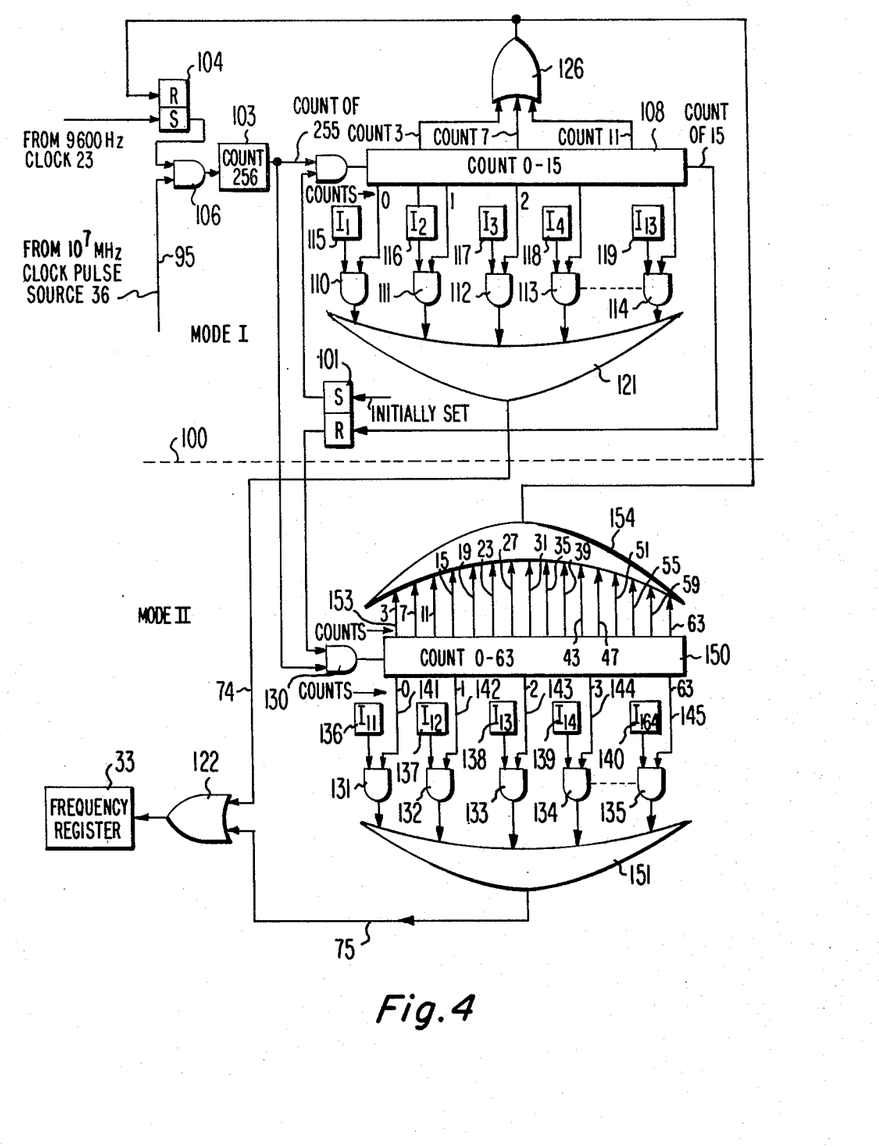
FIG. 4 is a logic diagram of a portion of the structure of FIG. 1.

Referring now to FIG. 4, there is shown a logic diagram of a suitable search control means 32 which can be employed in the structure FIG. 1. In FIG. 4 the logic above the dotted line 100 is the logic required for the mode I or acquisition portion of the signal and the logic below the dotted line 100 is the logic required for the data receiving mode II of the system.

Initially, flip-flop 101 is set so that AND gate 102 is primed to pass the 255$^{th}$ count of counter 103 therethrough.

The operation of the system begins with a pulse from the 9.6 KHz clock source 23 of FIG. 1 which sets flip-flop 104 and primes AND gate 106, thereby passing the $10^7$ MHz clock pulse source 36 of FIG. 1 through AND gate 106 to counter 103 which initially was set to zero. Also set to zero at the beginning of the operation is the counter 108 which counts from zero to fifteen. The first time counter 103 counts to its capacity of 255, it will output a signal through AND gate 102 into counter 108. During this first cycling of counter 103, AND gate 110 is primed by the zero count output lead 120 from counter 108 to supply the contents of register 115 through OR gate 121 and OR gate 122 into frequency register 33. The register 115 contains increment $I_1$ which is the increment necessary to generate a reference tone frequency of 1,170.

During the second time counter 103 counts through its capacity AND gate 111 will primed by the output lead 123 of counter 108 to supply the increment $I_2$ contained in register 116 through OR gates 121 and 122 to frequency register 133. The increment $I_2$ is sufficient to cause the accumulator to generate a gating frequency which will produce a reference signal tone of 1.175 Hz. In a similar manner, upon the next two cyclings of counter 103 through its capacity, AND gates 112 and 113 will be primed to supply the incremental values $I_3$ and $I_4$ through OR gates 121 and 122 to frequency register 33 to generate an accumulator overflow frequency resulting in the generation of reference signal tones of frequencies of 1,180 Hz and 1,185 Hz.

The counter has now cycled through its capacity four times and the counter 108 contains a count of three. The count of three is supplied through OR gate 126 to reset flip-flop 104 thereby enabling the system to wait for the occurrence of the next pulse from the 9,600 pulse per second source 23 of FIG. 1. It will be recalled that the period of a clock pulse from source 23 is slightly greater than the time required to fill the reference register four times with four different digitzed reference tones. It is necessary to synchronize each group of four reference tones with the occurrence of a pulse from the clocking source 23 which is accomplished by resetting flip-flop 104 every 4 counts of counter 108. In the manner described above, reference signals are generated up to 1,230 Hz in 5 Hz increments.

At the count of 15 of counter 108 flip-flop 101 is reset thereby disabling mode I of the system and enabling mode II. The output of counter 103 will now pass through AND gate 130 which is primed by the resetting of flip-flop 101.

During the first cycling of counter 103 in mode II AND gate 131 is primed by the zero count of counter 150 to supply increment $I_{11}$ stored in register 136 through OR gates 151 and 122 to frequency register 33 to generate a tone of 300 Hz. During the second, third and fourth cyclings of counter 103, the AND gate 132, 133 and 134 are successively primed to successively pass increments $I_{12}$, $I_{13}$ and $I_{14}$ through OR gates 151 and 122 to frequency register 33 to generate tones of 337.5 Hz, 375 Hz and 412.5 Hz.

After the fourth cycling, when counter 150 attains a count of three, a signal is outputted via lead 153 through OR gate 154 to reset flip-flop 104 thereby disabling AND gate 106 and causing the counting of counter 103 to pause until the occurrence of next clock pulse from clock pulse source 23 of FIG. 1 in much the same manner as discussed in connection with mode I after the fourth cycling of counter 103.

Similarly, after successive fourth countings of the counter 103, i.e. at counts 7, 11, 15, 19, 23, 27, 31, 35, 39, 43, 47, 51, 55, 59 and 63, a signal is outputted through OR gate 154 to reset flip-flop 104 and thereby causing the counting of counter 103 to wait for the occurrence of the next pulse from clock pulse source 23.

Thus, the increments required to be supplied to the frequency register 33 for the generation of the sixty-four tones ranging from 300 Hz to 2,700 Hz are produced by the logic below the dotted line 100 of FIG. 4.

The control function illustrated in FIG. 4 may be implemented by a microprocessor, where the various frequency values are stored in a read only memory (ROM) and the selection gating function is performed by the memory addressing function.

Similarly, it is not necessary to generate the reference frequencies continuously in a hardware arithmetic synthesizer. Instead all the required reference frequencies can be computed by the microprocessor at the beginning of system operation. The resulting binary patterns of 1 and 0 bits can be stored in a random-accessmemory (RAM). As the particular reference patterns are needed they can be read from memory and applied to the correlator's reference register.

Other variations of the above hardware or hardware/software implementations of the rapid sequential frequency search using correlation between the signal and a plurality of references can readily be visualized.

What is claimed is:

1. A system for determining the frequency of an input signal received during a time period T and comprising:
    means for digitizing said input signal at a bit rate $f_c$ and for storing the digitized bits of said input signal during said time period T;
    means for generating a successive series of digitized reference signals whose frequencies are represented by different patterns of binary 1's and 0's, with said frequencies being spaced apart by predetermined frequency intervals and including a reference signal having the same frequency as that of said received signal;
    reference register means;
    means for clocking said series of digitized reference signals into said reference register means during said time period T;
    means for comparing the stored digitized input signal with successive reference signals entered into said reference register means to produce output signals whose magnitudes are proportional to the degree of correlation therebetween; and

13 means for determining the largest output signal and the frequency of the particular reference signal which resulted in said largest output signal.

2. A system as in claim 1 and further comprising:
means responsive to the frequency of said particular reference signal to alter the frequency of said input signal by an amount determined by the frequency of said particular reference signal.

3. A system as in claim 1 in which said means for determining the largest output signal produced by said means for comparing comprises:
first storage means for storing selected ones of said output signals; and
means comprising amplitude comparing means for transferring a newly generated output signal into said storage means if its amplitude is larger than that of the output signal already stored in said storage means.

4. A system as in claim 1 in which said means for determining the frequency of the given reference signal producing the highest output signal comprises:
storage means for storing the digitally represented frequency of each reference signal which produces, when compared with said input signal, a higher output signal than the one stored in said output signal storage means; and
means for reading the digitally represented frequency in said frequency storage means when the entire range of reference signals have been compared with said input signal.

5. A system as in claim 1 in which said input signal comprises a series of time synchronous signals each of a time period T and of various frequencies falling within the range of frequencies of said reference signals and in which:
said means for digitizing and storing comprises an input register having a number N of bit positions such that $N/f_c \geq T$; and
in which said reference register means comprises a number M of bit positions such that $M \geq Tf_c$.

6. A system as in claim 5 in which said means for determining the largest output signal from said means for comparing comprises:
first storage means for storing selected ones of said output signals;
means comprising amplitude comparing means for transferring a newly generated output signal into said storage means if its amplitude is larger than that of the output signal already stored in said storage means; means responsive to a predetermined time interval during which no new highest output signal is generated to indicate the occurrence of a maximum correlation between a reference signal and said input signal; and
means for setting the recorded amplitude value in said first storage means to zero after said predetermined time delay in preparation for the determination of the frequency of the next time synchronous signal.

7. A system as in claim 6 in which said means for determining the frequency of the given reference signal producing the highest output signal comprises:
second storage means for storing the frequency of each reference signal which produces, when compared with said input signal, a higher output signal than the one stored in said output signal storage means;

14 means for reading the frequency in said second storage means in response to the occurrence of each of said time intervals.

8. A system as in claim 6 and further comprising:
synchronizing signal generating means responsive to the average time occurrence of said predetermined time intervals to generate synchronizing signals marking the beginning of each time synchronous input signal.

9. Means for determining the frequency of an input signal received during a time period T and comprising:
input register means;
means for sampling and storing the samples of said input signal in said input register means at a rate $f_c$;
means for generating a successive series of reference signals whose frequencies are represented by patterns of quantized values, spaced apart by predetermined frequency intervals and including a pattern representing the frequency of the received input signal;
reference register means;
means for clocking said successive series of digitized reference signals into said reference register means during each time period T;
means for comparing the input signal in said input register means with successive reference signals in said reference register means to produce output signals whose magnitudes are proportional to the degree of correlation between said input and reference signals; and
means for determining the largest of said output signals and the particular reference signal resulting in such largest output signal.

10. A method for determining the frequency of an input signal comprising:
digitizing and storing the digitized bits of said input signal at a bit rate $f_c$ and during a time period T;
generating a successive series of digitized reference signals whose frequencies are represented by binary 1's and 0's and spaced apart by predetermined frequency intervals;
clocking said series of digitized reference signals into a reference register means during said time period T;
comparing the digitized input signal with successive reference signals to produce output signals having magnitudes proportional to the degree of correlation therebetween; and
determining the largest output signal and the frequency of the reference signal which produces said largest output signal.

11. A method as in claim 10 in which the steps of determining the largest output signal comprises:
storing the first generated output signal in an output signal storage means;
comparing the amplitude of each newly generated output signal as it is generated with the amplitude of the output signal stored in said storage means; and
storing a newly generated output signal into said storage means if its amplitude is larger than that of the output signal already stored in said storage means.

12. A method as in claim 11 in which the steps of determining the frequency of the reference signal producing the highest output signal comprises:
entering into a storage means the frequency of each reference signal which produces, when compared with said input signal, a higher output signal than the one stored in said output signal storage means; and reading the stored frequency when the entire range of reference signals has been compared with said input signal.

13. A method as in claim 10 in which said input signal comprises a series of time synchronous signals each of a time duration T and of various frequencies falling within the range of frequencies of said reference signals and further comprising the steps of:

storing said digitized bits of said input signal over a period $N/f_c \geq T$, where N is the number of storage bit positions; and storing said bits of said reference signals in a storage means having M bit positions where $M \geq Tf_c$.

14. A method as in claim 13 in which the steps of determining the largest output signal comprises:

storing the first generated output signal in an output signal storage means;

comparing the amplitude of each output signal as it is generated with the amplitude of the output signal stored in said output signal storage means;

storing a newly generated output signal into said output signal storage means if its amplitude is larger than that of the output signal already stored in said storage means;

measuring a predetermined time interval during which no new high output signals are generated to indicate a maximum correlation between a reference signal and said input signal; and setting the recorded amplitude value in said output signal storage means to zero after said predetermined time interval in preparation for the determination of the frequency of the next received time synchronous input signal.

15. A method as in claim 13 in which the step of determining the frequency of the reference signal producing the highest output signal comprises:

entering into a storage means the frequency of each reference signal which produces, when compared with said input signal, a higher output signal than the one stored in said output signal storage means; and reading the last stored frequency upon the occurrence of one of said time intervals.

* * * * *

UNITED STATES PATENT AND TRADEMARK OFFICE
CERTIFICATE OF CORRECTION

PATENT NO. : 4,291,269

DATED : September 22, 1981

INVENTOR(S) : Edward Joachim Nossen

It is certified that error appears in the above-identified patent and that said Letters Patent is hereby corrected as shown below:

On the title page, in the abstract, line 4, "bite" should be ---bit---.

*Signed and Sealed this*

*Second Day of February 1982*

[SEAL]

*Attest:*

GERALD J. MOSSINGHOFF

*Attesting Officer*     *Commissioner of Patents and Trademarks*